US011839085B2

(12) United States Patent
Yin et al.

(10) Patent No.: US 11,839,085 B2
(45) Date of Patent: Dec. 5, 2023

(54) THREE-DIMENSIONAL VERTICAL SINGLE TRANSISTOR FERROELECTRIC MEMORY AND MANUFACTURING METHOD THEREOF

(71) Applicant: INSTITUTE OF MICROELECTRONICS, CHINESE ACADEMY OF SCIENCES, Beijing (CN)

(72) Inventors: Huaxiang Yin, Beijing (CN); Zhaozhao Hou, Beijing (CN); Tianchun Ye, Beijing (CN); Chaolei Li, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 302 days.

(21) Appl. No.: 17/423,082

(22) PCT Filed: Nov. 4, 2019

(86) PCT No.: PCT/CN2019/115250
§ 371 (c)(1),
(2) Date: Jul. 14, 2021

(87) PCT Pub. No.: WO2020/206997
PCT Pub. Date: Oct. 15, 2020

(65) Prior Publication Data
US 2022/0085070 A1    Mar. 17, 2022

(30) Foreign Application Priority Data

Apr. 11, 2019  (CN) .......................... 201910290800.4

(51) Int. Cl.
*H10B 51/20* (2023.01)
*H01L 21/28* (2006.01)
(Continued)

(52) U.S. Cl.
CPC ........ *H10B 51/20* (2023.02); *H01L 29/40111* (2019.08); *H01L 29/516* (2013.01); *H10B 51/30* (2023.02)

(58) Field of Classification Search
CPC . H01L 29/40111; H01L 29/516; H10B 51/10; H10B 51/20; H10B 51/30
See application file for complete search history.

(56) References Cited

U.S. PATENT DOCUMENTS

| 2012/0140562 | A1  | 6/2012 | Choe et al. |
| 2015/0041873 | A1* | 2/2015 | Karda ............... H01L 29/78642 257/295 |
| 2020/0212068 | A1* | 7/2020 | Lee ....................... H01L 29/517 |

FOREIGN PATENT DOCUMENTS

| CN | 105390500 | A | * | 3/2016 | |
| CN | 107068686 | A | * | 8/2017 | ........ H01L 27/11556 |

(Continued)

OTHER PUBLICATIONS

PCT International Search Report in PCT/CN2019/115250.

*Primary Examiner* — Matthew E Warren
(74) *Attorney, Agent, or Firm* — Goodwin Procter LLP

(57) ABSTRACT

Provided are a three-dimensional vertical single transistor ferroelectric memory and a manufacturing method thereof. The ferroelectric memory comprises: a substrate; an insulating dielectric layer provided at the substrate; a channel structure extending through the insulating dielectric layer and connected to the substrate, the channel structure having a source/drain region and a channel region connected to the source/drain region; and a gate stack structure arranged around the channel structure and provided in the insulating dielectric layer opposite to the channel region, the gate stack structure comprising a ferroelectric insulation layer and a gate sequentially stacked in a direction away from the channel structure. The ferroelectric memory having the (Continued)

above structure can replace conventional DRAMs. Therefore, the invention realizes a high intensity high speed memory.

16 Claims, 8 Drawing Sheets

(51) Int. Cl.
*H01L 29/51* (2006.01)
*H10B 51/30* (2023.01)

(56) References Cited

FOREIGN PATENT DOCUMENTS

| | | | |
|---|---|---|---|
| CN | 107068686 A | 8/2017 | |
| CN | 109273444 A | 1/2019 | |
| CN | 109473431 A | 3/2019 | |
| CN | 110047844 A | 7/2019 | |
| WO | WO-2018144957 A1 * | 8/2018 | ......... G11C 11/5628 |

* cited by examiner

THREE-DIMENSIONAL VERTICAL SINGLE TRANSISTOR FERROELECTRIC MEMORY AND MANUFACTURING METHOD THEREOF

This application claims priority to and is the national phase of International Application No. PCT/CN2019/115250, titled "THREE-DIMENSIONAL VERTICAL SINGLE TRANSISTOR FERROELECTRIC MEMORY AND MANUFACTURING METHOD THEREOF," filed on Nov. 4, 2019, which claims the priority to Chinese Patent Application No. 201910290800.4, titled "THREE-DIMENSIONAL VERTICAL SINGLE-TRANSISTOR FERROELECTRIC MEMORY AND METHOD FOR MANUFACTURING THE SAME", filed on Apr. 11, 2019 with China National Intellectual Property Administration, which is incorporated herein by reference in its entirety.

FIELD

The present disclosure relates to the field of semiconductor technology, and in particular, to a three-dimensional vertical single-transistor ferroelectric memory and a method for manufacturing the same.

BACKGROUND

A ferroelectric RAM (FRAM) based on a ferroelectric material is advantageous in a small size and a high density of cells, low power consumption, fast write operations, and non-volatile permanent storage. The FRAM has a prospect of replacing conventional dynamic RAMs (DRAMs), static RAMs (SRAMs), and the like, and would be widely applied to high-performance computing chips, for example, embedded memories (such as eDRAM and eFLASH), memory computing, and artificial intelligence chips.

The artificial intelligence chip requires a large number of instantaneous memory cells, and hence it is important to provide a DRAM and a FLASH with a higher density and lower power consumption. Storage densities of conventional 1T1C DRAMs would keep increasing in the future. An access transistor and a storage capacitor in the conventional 1T1C DRAM have developed from a planar structure toward a 3D structure, and an overall structure of the conventional 1T1C DRAM has a trend of being vertical and three-dimensional. An overall structure of conventional NAND memories also goes three-dimensional.

A high mobility channel, such as a SiGe channel, in 3D NAND can achieve stronger capacitive coupling under a fixed physical thickness. It facilitates improving the storage density and a P/E speed of the device, reduces an operating voltage of the device, and achieves a larger memory window and better reliability.

Meanwhile, the FRAM has developed from 1T1C toward 1T, and even to a 3D device structure. Therefore, an urgent objective to be achieved is how to apply a method for manufacturing 3D NAND to the manufacture of the 1T FRAM with a vertical 3D structure, so as to provide a high-density and high-speed memory as replacement of the conventional DRAM.

SUMMARY

A main objective of the present disclosure is to provide a three-dimensional vertical single-transistor ferroelectric memory and a method for manufacturing the same, so as to achieve a high-density and high-speed memory with reference to a process of manufacturing 3D NAND.

In order to achieve the above objective, a three-dimensional vertical single-transistor ferroelectric memory is provided according to an aspect of the present disclosure, including: a substrate; an insulating dielectric layer disposed on the substrate; a channel structure running through the insulating dielectric layer and in contact with the substrate, where the channel structure includes a source-drain region and a channel region in contact with the source-drain region; and a gate stack structure surrounding the channel structure, where the gate stack structure is disposed in the insulating dielectric layer at a position adjacent to the channel region, and the gate stack structure includes a ferroelectric insulating layer and a gate electrode that are sequentially stacked, and the gate electrode is at a side of the ferroelectric insulating layer away from the channel structure.

As a further embodiment, a channel material of the channel region is one or more of: Si, Ge, GeSi, or a III-V compound semiconductor. In a preferable embodiment, mobility of the channel material is greater than 1000 $cm^2$/V·s.

As a further embodiment, a ferroelectric material of the ferroelectric insulating layer is one or more of: HZO, HALO, HSiO, or PZT.

As a further embodiment, an insulating material of the insulating dielectric layer is one or more of: silicon oxide, oxynitride, or SiCN.

As a further embodiment, the three-dimensional vertical single-transistor ferroelectric memory further includes an isolation oxide layer, where the isolation oxide layer surrounds the channel structure, and the gate stack structure surrounds the isolation oxide layer.

As a further embodiment, the three-dimensional vertical single-transistor ferroelectric memory further includes a metal contact layer, where the metal contact layer runs through the insulating dielectric layer and is in contact with the source-drain region.

According to another aspect of the present disclosure, a method for manufacturing a three-dimensional vertical single-transistor ferroelectric memory is further provided, including: S1, forming an insulating material layer on a substrate, and forming a channel structure running through the insulating material layer, to make a channel material in contact with the substrate, where the channel structure includes a source-drain region and a channel region in contact with the source-drain region; and S2, removing a part of the insulating material layer at a position adjacent to the channel region, and forming, in a cavity in the insulating material layer, a gate stack structure surrounding the channel structure, where the gate stack structure includes an isolation oxide layer, a ferroelectric insulating layer, and a gate electrode that are sequentially stacked, the ferroelectric insulating layer is at a side of the isolation oxide layer away from the channel structure, and the gate electrode is at a side of the ferroelectric insulating layer away from the channel structure.

As a further embodiment, the step S1 includes: S11, depositing, on the substrate, non-doped isolation insulating layers and heavily doped isolation insulating layers to form the insulating material layer, where the insulating material layer includes layer groups, each of which includes one or more of the non-doped isolation insulating layers and one or more of the heavily doped isolation insulating layers that are alternately stacked; S12, forming, in the insulating material layer, a first through hole reaching the substrate, and filling the first through hole with the channel material; and S13, annealing the heavily doped isolation insulating layers, where dopants in the heavily doped isolation insulating layers diffuse laterally into the channel material in the annealing to form the source-drain region, and a part of the channel material without the dopants forms the channel region.

As a further embodiment, after forming the first through hole and before filling the first through hole with the channel material, the step S12 further includes: depositing the isolation oxide layer on a sidewall of the first through hole.

As a further embodiment, the insulating material layer includes a first insulating layer stack and a second insulating layer stack, and the step S11 includes: forming, on the substrate, at least one of the layer groups to form the first insulating layer stack, where a layer that is in the first insulating layer stack and farthest from the substrate is one of the non-doped isolation insulating layers; forming a dummy gate layer on the first insulating layer stack; and forming, on the dummy gate layer, another at least one of the layer groups to form the second insulating layer stack, where a layer that is in the second insulating layer stack and adjacent to the dummy gate layer is another one of the non-doped isolation insulating layers.

As a further embodiment, the step S2 includes: S21, forming a second through hole reaching the substrate, in the insulating material layer at two sides of the channel structure, to expose a part of the dummy gate layer, and removing the part of the dummy gate layer to form a third through hole reaching the channel structure, where the third through hole connects the second through hole; and S22, filling the third through hole with a ferroelectric material and a gate material sequentially to form the gate stack structure, where the ferroelectric material wraps the gate material.

As a further embodiment, the step S22 includes: filling the second through hole and the third through hole, with the ferroelectric material and the gate material sequentially, where the ferroelectric material wraps the gate material; etching the ferroelectric material and the gate material in the second through hole to expose a part of the substrate corresponding to the second through hole; etching the ferroelectric material and the gate material in the third through hole to expose a part of a surface of the third through hole, where the part of the surface is adjacent to the second through hole; and filling the exposed third through hole with an insulating material, to form an insulating dielectric layer wrapping the gate stack structure. In a preferable embodiment, the ferroelectric material and the gate material in the third through hole is etched through selective lateral etching.

As a further embodiment, a part of the heavily doped isolation insulating layers is exposed when forming the second through hole in the step S2. After the step S2, the method may further include: removing the heavily doped isolation insulating layers to form a fourth through hole in contact with the source-drain region; and filling the fourth through hole with a metal material, to form a metal contact layer in contact with the source-drain region.

In the technical solutions according to the present disclosure, the three-dimensional vertical single-transistor ferroelectric memory is provided. The ferroelectric memory includes an insulating dielectric layer, the channel structure and the gate stack structure. The channel structure runs through the insulating dielectric layer and is in contact with the substrate. The channel structure includes the source-drain region and the channel region in contact with the source-drain region. The gate stack structure surrounds the channel structure, and is disposed in the insulating dielectric layer at the position adjacent to the channel region. The gate stack structure includes the ferroelectric insulating layer and the gate electrode that are sequentially stacked, and the gate electrode is at the side of the ferroelectric insulating layer away from the channel structure. The ferroelectric memory with the above structure can serve as a replacement of the conventional DRAM, and a high-density and high-speed memory is achieved.

BRIEF DESCRIPTION OF THE DRAWINGS

The drawings form a part of the present disclosure, and are intended to provide further understanding of the present disclosure. Exemplary embodiments of the present disclosure and description thereof are intended to explain the present disclosure and do not constitute an undue limitation on the present disclosure.

DETAILED DESCRIPTION

It should be noted that embodiments of the present disclosure and features in the embodiments may be combined with each other as long as there is no conflict. Hereinafter the present disclosure is described in detail with reference to the drawings and in conjunction with the embodiments.

Hereinafter technical solutions in embodiments of the present disclosure are described clearly and completely in conjunction with the drawings in embodiments of the present closure, in order to help those skilled in the art understand the solutions better. Apparently, the described embodiments are only some rather than all of the embodiments of the present disclosure. Any other embodiments obtained based on the embodiments of the present disclosure by those skilled in the art without any creative effort fall within the scope of protection of the present disclosure The terms such as "first" and "second" in the specification, claims, and accompanying drawings of the present disclosure are intended to distinguish similar objects rather than describe a particular sequence or a particular order. It is to be understood that the data termed in such a way are interchangeable in proper circumstances, so that the embodiments of the present disclosure described herein can be implemented in an order besides one illustrated or described herein. In addition, the terms "include", "comprise" and any other variants are intended to cover the non-exclusive inclusion. For example, a process, a method, a system, a product, or a device that includes a series of steps or units is not necessarily limited to those expressly listed steps or units, but may include other steps or units not expressly listed or inherent to such process, such method, such product, or such device.

Figure 1:
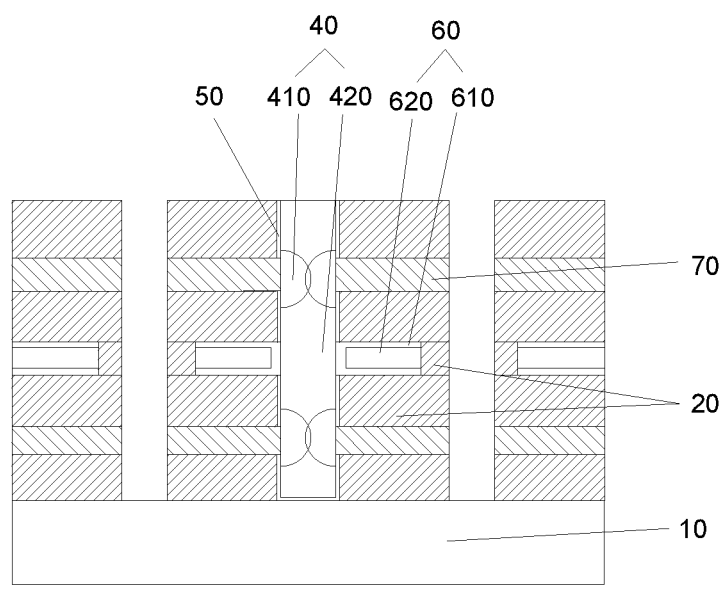
FIG. 1 shows a schematic structural diagram of a cross section of a three-dimensional vertical single-transistor ferroelectric memory according to an embodiment of the present disclosure.
Figure 2:
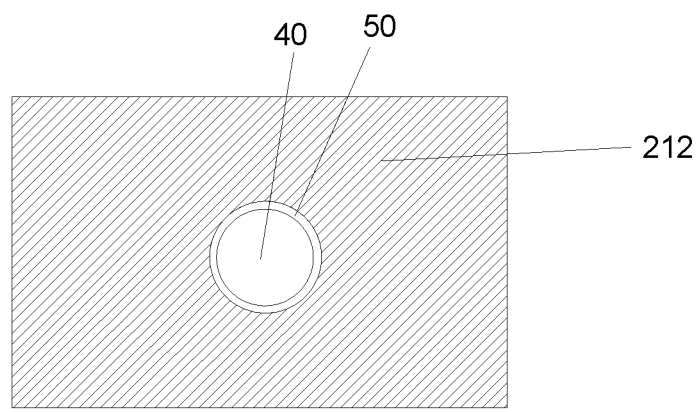
FIG. 2 shows a schematic structural diagram of a top view of the three-dimensional vertical single-transistor ferroelectric memory as shown in FIG. 1.

As described in the section of background, an urgent objective to be achieved is how to apply a method for manufacturing 3D NAND to manufacture of a 1T FRAM with a vertical 3D structure, so as to provide a high-density and high-speed memory as replacement of the conventional DRAM. A three-dimensional vertical single-transistor ferroelectric memory is proposed on a basis of researches on the above issue. As shown in FIG. 1 and FIG. 2, the ferroelectric memory includes a substrate 10, an insulating dielectric layer 20, a channel structure 40, and a gate stack structure 60. The insulating dielectric layer 20 is disposed on the substrate 10. The channel structure 40 runs through the insulating dielectric layer 20 and is in contact with the substrate 10. The channel structure 40 includes the source-drain region 410 and the channel region 420 in contact with the source-drain region 410. The gate stack structure 60 surrounds the channel structure 40, and is disposed in the insulating dielectric layer 20 at a position adjacent to the channel region 420. The gate stack structure 60 includes a ferroelectric insulating layer 610 and a gate electrode 620 that are sequentially stacked, and the gate electrode 620 is at a side of the ferroelectric insulating layer 610 away from the channel structure 40.

In the ferroelectric memory, the channel structure runs through the insulating dielectric layer and is in contact with the substrate. The channel structure includes the source-drain region and the channel region in contact with the source-drain region. The gate stack structure surrounds the channel structure, and is disposed in the insulating dielectric layer at a position adjacent to the channel region. The gate stack structure includes the ferroelectric insulating layer and the gate electrode that are sequentially stacked, and the gate electrode is at the side of the ferroelectric insulating layer away from the channel structure. The ferroelectric memory with the above structure can serve as a replacement of the conventional DRAM, and thereby a high-density and high-speed memory can be achieved.

In the ferroelectric memory, a cross section that is of the channel structure 40 and parallel with the substrate 10 may be a perfect circle, an ellipse, a rectangle, a rounded rectangle, or the like. Reference is made to FIG. 2.

In the ferroelectric memory, a channel material 421 may be one or more of: Si, Ge, GeSi, or a III-V compound semiconductor, and may be amorphous, polycrystalline, single-crystalline, or the like. Generally, a high mobility channel is applied to a method for manufacturing 3D NAND, in order to obtain stronger capacitive coupling under a same physical thickness. Thereby, a storage density and a P/E speed of the device are improved, and an operating voltage of the device is reduced, achieving a larger memory window and better reliability. The aforementioned ferroelectric memory according to embodiments of the present disclosure is manufactured with reference to a method of manufacturing 3D NAND. Therefore, the channel material 421 forming the channel region 420 is a semiconductor with high mobility. In a preferable embodiment, mobility of the channel material 421 is greater than 1000 $cm^2/V \cdot s$.

In the ferroelectric memory, a gate material of the gate electrode 620 may be one of polysilicon, amorphous silicon, or a metal gate material. In a preferable embodiment, a ferroelectric material 611 forming the ferroelectric insulating layer 610 may be one or more of HZO, HALO, HSiO, or PZT. The ferroelectric material 611 is not limited to the above preferable materials, and those skilled in the art may select another appropriate ferroelectric material 611 based on conventional technology.

In the ferroelectric memory, as a preferable embodiment, an insulating material of the insulating dielectric layer 20 may be one or more of silicon oxide, oxynitride, or SiCN. The insulating material is not limited to the above preferable materials, and those skilled in the art may select another appropriate insulating material based on conventional technology The ferroelectric memory in the present disclosure may further include an isolation oxide layer 50 and a metal contact layer 70. As shown in FIG. 1, the isolation oxide layer 50 surrounds the channel structure 40, and the gate stack structure 60 surrounds the isolation oxide layer 50. The metal contact layer 70 runs through the insulating dielectric layer 20 and is in contact with the source-drain region 410. Those skilled in the art may select appropriate materials for the isolation oxide layer 50 and the metal contact layer 70 according to conventional technology. For example, the isolation oxide layer 50 may be made of $SiO_2$, and the metal contact layer 70 may be made of W, Co, Al, or the like.

According to another aspect of the present disclosure, a method for manufacturing a three-dimensional vertical single-transistor ferroelectric memory is further provided. As shown in FIG. 3 to FIG. 15, the manufacturing method includes steps S1 and S2. In step S1, an insulating material layer is formed on a substrate 10, and a channel structure 40 running through the insulating material layer is formed, such that a channel material 421 is connected to the substrate 10. The channel structure 40 includes a source-drain region 410 and a channel region 420 in contact with the source-drain region 410. In step S2, a part of the insulating material layer is removed at a position adjacent to the channel region 420, and a gate stack structure 60 surrounding the channel structure 40 is formed in a cavity in the insulating material layer. The gate stack structure 60 includes an isolation oxide layer 50, a ferroelectric insulating layer 610 and a gate electrode 620 that are sequentially stacked. The ferroelectric insulating layer 610 is at a side of the isolation oxide layer 50 away from the channel structure 40, and the gate electrode 620 is at a side of the ferroelectric insulating layer 610 away from the channel structure 40.

In the above method, a 1T FRAM with a completely vertical and 3D structure is manufactured with reference to a method for manufacturing 3D NAND. Thereby, the fabricated ferroelectric memory can serve as replacement of a conventional DRAM, and a high-density and high-speed memory can be achieved.

Hereinafter the methods for manufacturing the three-dimensional vertical single-transistor ferroelectric memory according to exemplary embodiments of the present disclosure are provided in more details. The exemplary embodiments may be implemented in various forms, and should not be construed as being limited to those illustrated herein. It should be understood that these embodiments are aimed at making the present disclosure thorough and complete, and conveying a full concept thereof to those skilled in the art.

First, the step S1 is performed. The insulating material layer is formed on the substrate 10, and the channel structure 40 running through the insulating material layer is formed, such that a channel material 421 layer is in contact with the substrate 10. The channel structure 40 includes the source-drain region 410 and the channel region 420 in contact with the source-drain region 410. Reference is made to FIG. 3 to FIG. 8.

Figure 3:
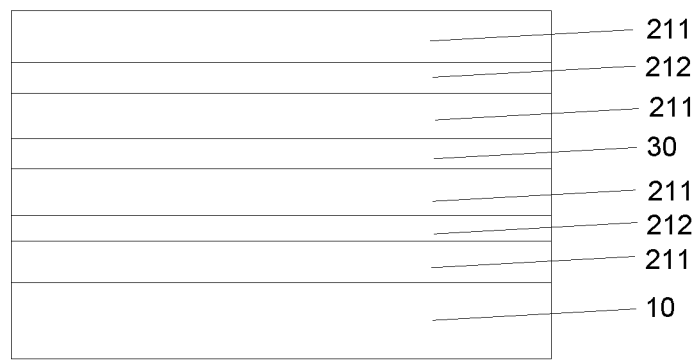
FIG. 3 shows a schematic structural diagram of a cross section of an intermediate body after multiple layer groups of non-doped isolation insulating layers and heavily doped isolation insulating layers that are alternately stacked are formed on a substrate, in a method for manufacturing a three-dimensional vertical single-transistor ferroelectric memory according to an embodiment of the present disclosure.
Figure 4:
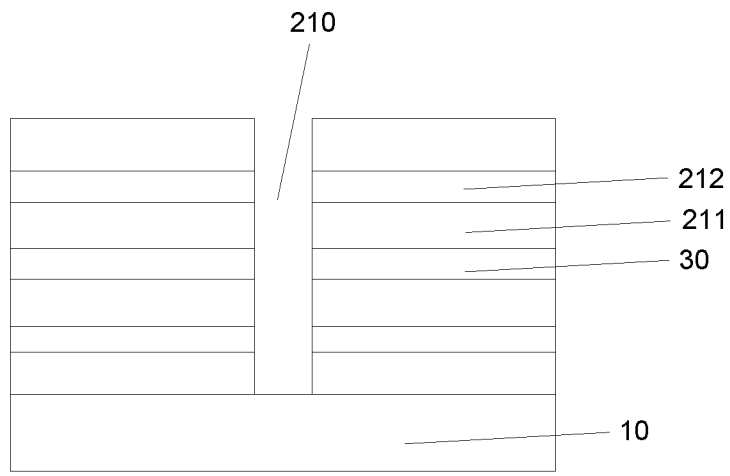
FIG. 4 shows a schematic structural diagram of a cross section of the intermediate body after a first through hole in contact with the substrate is formed in an insulating material layer as shown in FIG. 3.
Figure 8:
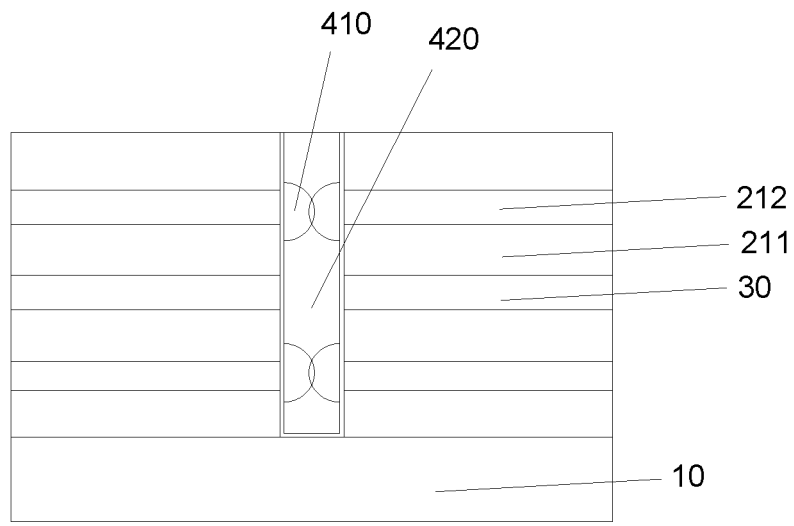
FIG. 8 shows a schematic structural diagram of a cross section of the intermediate body after the heavily doped isolation insulating layers as shown in FIG. 7 are annealed.

The step S1 may include steps S11 to S13. Reference is made to FIG. 3. In step S11, non-doped isolation insulating layers 211 and heavily doped isolation insulating layers 212 are deposited on the substrate 10, to form an insulating material layer. The insulating material layer includes layer groups, each of which includes the non-doped isolation insulating layer(s) 211 and the heavily doped isolation insulating layer(s) 212 that are alternately stacked. Reference is made to FIG. 4 to FIG. 7. In step S12, a first through hole 210 reaching the substrate 10 is formed in the insulating material layer, and the first through hole 210 is filled with the channel material 421. Reference is made to FIG. 8. In step S13, the heavily doped isolation insulating layers 212 are annealed, such that dopants in the heavily doped isolation insulating layers 212 diffuse laterally into the channel material 421 to form the source-drain region(s) 410. A part of the channel material 421 without the dopants forms the channel region 420.

In the step S11, a material of the non-doped isolation insulating layer 211 may be oxynitride, silicon oxide, SiCN, amorphous carbon (a-C), or the like. A material of the heavily doped isolation insulating layer 212 may be oxynitride, silicon oxide, a high dielectric constant (low-k) material, SiCN, or the like, which is doped.

In a preferable embodiment, the insulating material layer includes a first insulating layer stack and a second insulating layer stack. The step S11 includes follows steps. At least one layer group, each of which includes the non-doped isolation insulating layer(s) 211 and the heavily doped isolation insulating layer(s) 212 that are alternately stacked, is formed on the substrate 10 to form the first insulating layer stack. A layer, which is in the first insulating layer stack and farthest from the substrate 10, is a non-doped isolation insulating layer 211. A dummy gate layer 30 is formed on the first insulating layer stack. Another at least one layer group, each of which includes the non-doped isolation insulating layer(s) 211 and the heavily doped isolation insulating layer(s) 212 that are alternately stacked, is formed on the dummy gate layer 30 to form the second insulating layer stack. A layer, which is in the second insulating layer stack and adjacent to the dummy gate layer 30 is another non-doped isolation insulating layer 211. Reference is made to FIG. 3.

In the step S12, the channel material 421 may be one or more of Si, Ge, GeSi, and a III-V compound semiconductor, and may be amorphous, polycrystalline, single-crystalline, or the like. In a preferable embodiment, the channel material 421 is a semiconductor of high mobility. In a more preferable embodiment, the mobility of the channel material 421 is greater than 1000 $cm^2/V \cdot s$. The ferroelectric memory according to embodiments of the present disclosure is manufactured with reference to a method for manufacturing 3D NAND. Generally, a high mobility channel is applied to a method for manufacturing 3D NAND, in order to obtain stronger capacitive coupling under a same physical thickness. Thereby, a storage density and a P/E speed of the device are improved, and an operating voltage of the device is reduced, achieving a larger memory window and better reliability.

Figure 5:
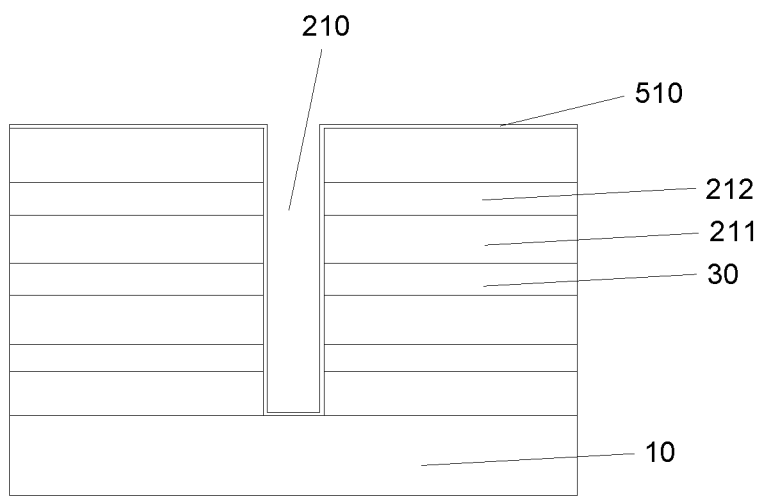
FIG. 5 shows a schematic structural diagram of a cross section of the intermediate body after an oxide material layer is formed on a surface of the insulating material layer and the first through hole as shown in FIG. 4.
Figure 6:
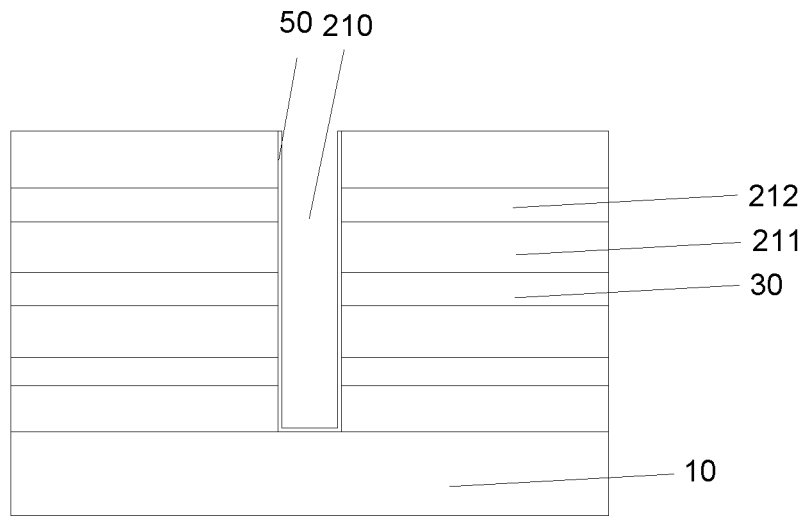
FIG. 6 shows a schematic structural diagram of a cross section of the intermediate body after an oxide material layer is formed on a surface of the insulating material layer and the first through hole as shown in FIG. 5.
Figure 7:
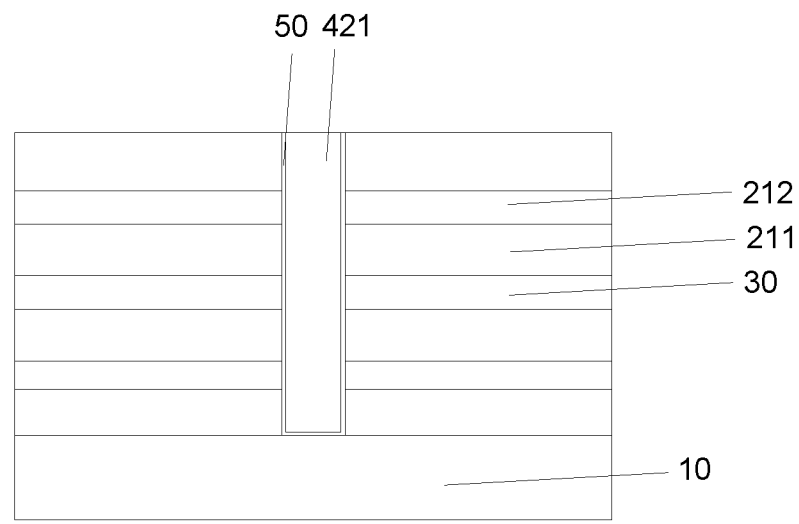
FIG. 7 shows a schematic structural diagram of a cross section of the intermediate body after the first through hole as shown in FIG. 5 is filled with a channel material.

After forming the first through hole 210 and before filling the first through hole 210 with the channel material 421, the step S12 may further include a following step. The isolation oxide layer 50 is deposited on a sidewall of the first through hole 210. In a specific embodiment, forming the isolation oxide layer 50 may include following steps. An oxide material such as $SiO_2$ is deposited on the substrate 10 to form an oxide material layer 510, as shown in FIG. 5. The oxide material layer 510 on a surface of the insulating material layer is etched, such that the oxide material layer 510 outside the first through hole 210 are removed. Thereby, the formed the isolation oxide layer 50 is only located at a surface of the first through hole 210, as shown in FIG. 6.

In the step S13, those skilled in the art may set appropriate conditions for the annealing process based on conventional technology, to implement lateral diffusion of the dopants in the heavily doped isolation insulating layer 212 into the channel material 421, which forms the source-drain region 410. Details of such process are not described herein.

The step S2 is performed after the step S1. The part of the insulating material layer at a position adjacent to the channel region 420 is removed, and the gate stack structure 60 surrounding the channel structure 40 is formed in the cavity in the insulating material layer. The gate stack structure 60 includes the isolation oxide layer 50, the ferroelectric insulating layer 610 and the gate electrode 620 that are sequentially stacked. The ferroelectric insulating layer 610 is at a side of the isolation oxide layer 50 away from the channel structure 40, and the gate electrode 620 is at a side of the ferroelectric insulating layer 610 away from the channel structure 40. Reference is made to FIG. 9 to FIG. 14.

Figure 9:
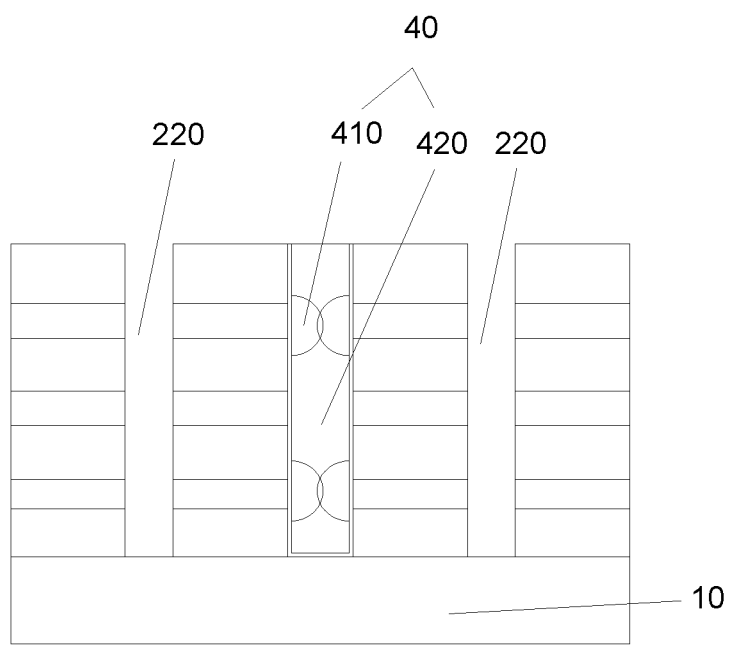
FIG. 9 shows a schematic structural diagram of a cross section of the intermediate body after second through holes in contact with the substrate are formed in the insulating material layer at two sides of the channel structure as shown in FIG. 8.
Figure 10:
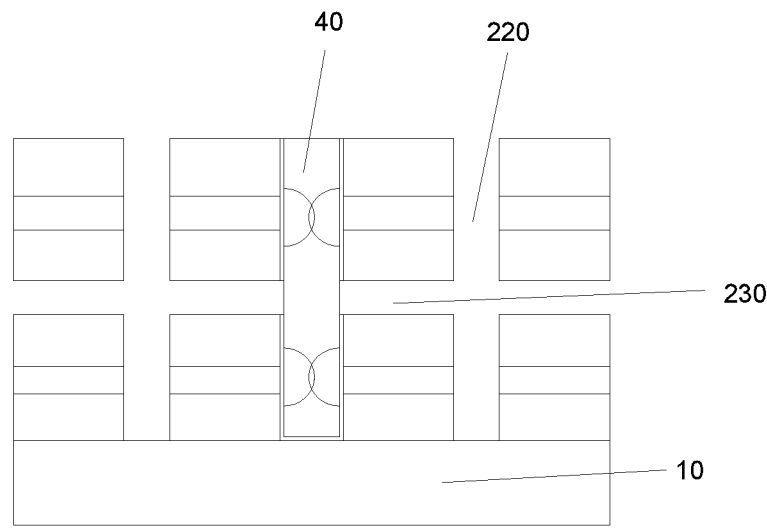
FIG. 10 shows a schematic structural diagram of a cross section of the intermediate body after third through holes in contact with the channel structure are formed by removing the dummy gate layer as shown in FIG. 9.

The step S2 may include steps S21 and S22. Reference is made to FIG. 9 and FIG. 10. In step S21, a second through hole(s) 220 reaching the substrate 10 is formed in the insulating material layer at two sides of the channel structure 40, to expose a part of the dummy gate layer 30. The part of the dummy gate layer 30 is removed to form a third through hole(s) 230 reaching the channel structure 40. The third through hole 230 connects the second through hole 220. Reference is made to FIG. 11 to FIG. 14. In step S22, the third through hole 230 is filled with a ferroelectric material 611 and a gate material 621 sequentially, such that the ferroelectric material 611 wraps the gate material 621 and the gate stack structure 60 is formed.

In the step S21, the second through hole 220 is first formed in the insulating material layer through etching, as shown in FIG. 9. Then, the dummy gate layer 30 may be removed through selective etching, to form the third through hole 230 connecting the second through hole 220, as shown in FIG. 10. Those skilled in the art may select an appropriate etching reagent for the selective etching based on an actual type of the dummy gate layer 30, which is not described in detail herein.

Figure 11:
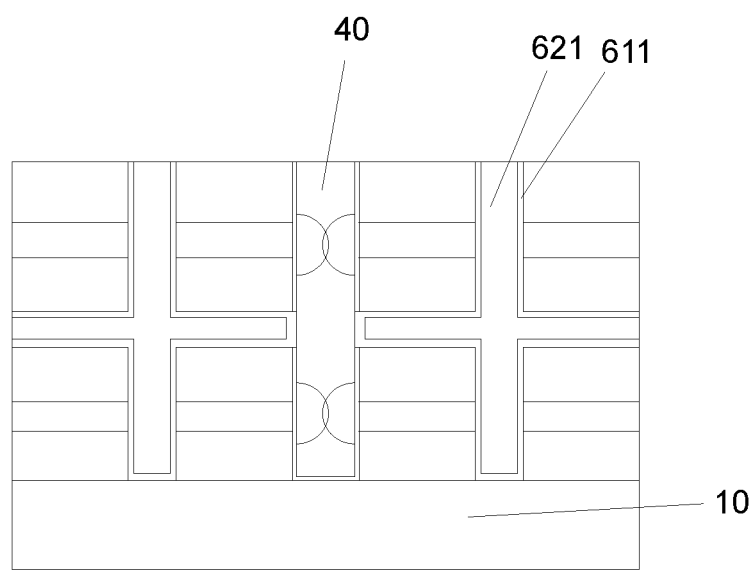
FIG. 11 shows a schematic structural diagram of a cross section of the intermediate body after the third through hole as shown in FIG. 10 is filled sequentially with a ferroelectric material and a gate material.
Figure 12:
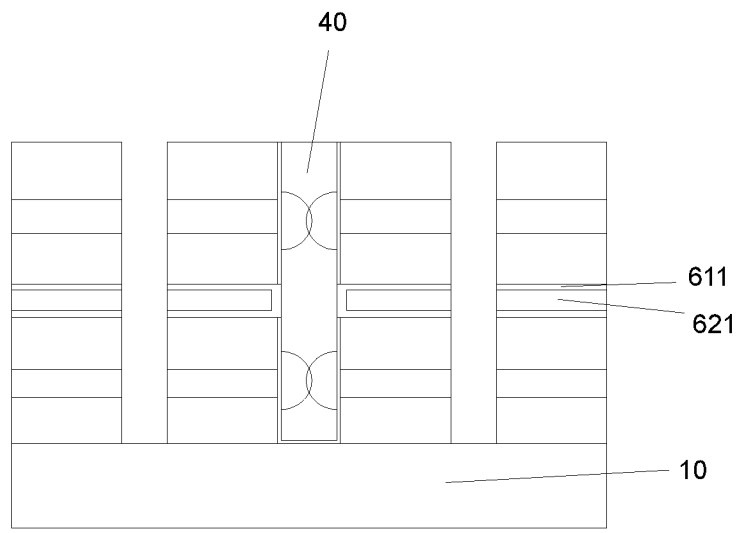
FIG. 12 shows a schematic structural diagram of a cross section of the intermediate body after the ferroelectric material and the gate material in the second through holes as shown in FIG. 11 are etched.
Figure 13:
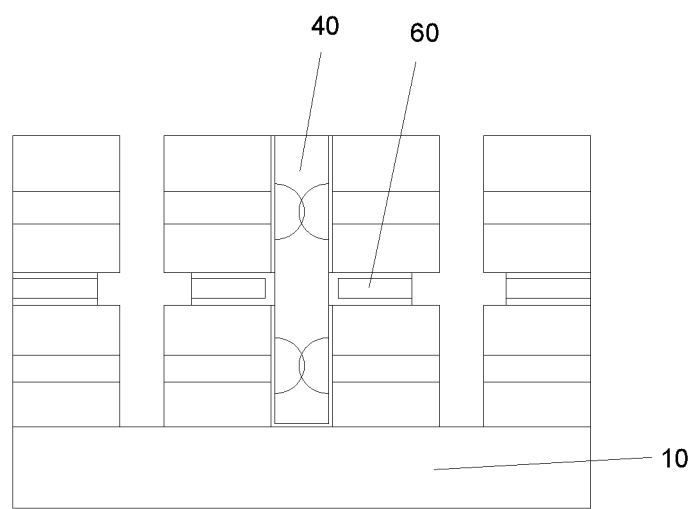
FIG. 13 shows a schematic structural diagram of a cross section of the intermediate body after the ferroelectric material and the gate material in the third through holes as shown in FIG. 12 are etched.
Figure 14:
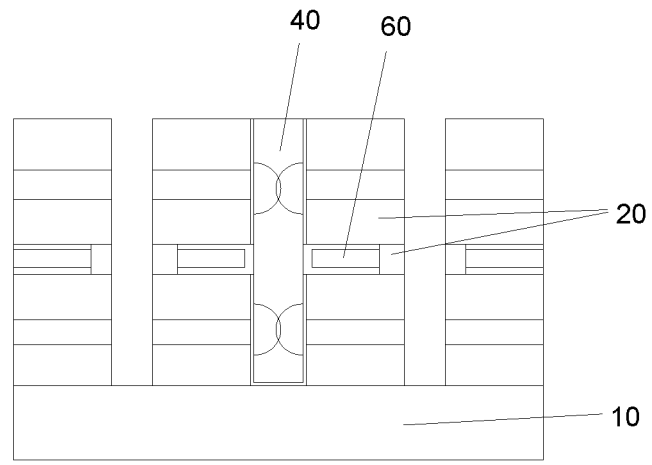
FIG. 14 shows a schematic structural diagram of a cross section of the intermediate body after an insulating material is filled in the exposed third through holes as shown in FIG. 13.

In a preferred embodiment, the step S22 includes following steps. The second through hole 220 and the third through hole 230 are filled with the ferroelectric material 611 and the gate material 621 sequentially, such that the ferroelectric material 611 wraps the gate material 621, as shown in FIG. 11. The ferroelectric material 611 and the gate material 621 in the second through hole 220 are etched to expose a part of the substrate 10, and the part of the substrate 10 corresponds to the second through hole 220, as shown in FIG. 12. The ferroelectric material 611 and the gate material 621 in the third through hole 230 are etched to expose a part of a surface of the third through hole 230, and the part of the surface of the third through hole 230 is adjacent to the second through hole 220, as shown in FIG. 13. The third through hole 230 is filled with an insulating material, so that the insulating material and the remaining non-doped isolation insulating layer 211 together form an insulating dielectric layer 20 that wraps the gate stack structure 60, as shown in FIG. 14.

On a basis of the above, in a preferable embodiment, the ferroelectric material 611 and the gate material 621 may be etched through selective lateral etching. Those skilled in the art may select an appropriate etching reagent for the selective etching, based on actual types of the ferroelectric material 611 and the gate material 621. Details of the above process are not described herein.

Figure 15:
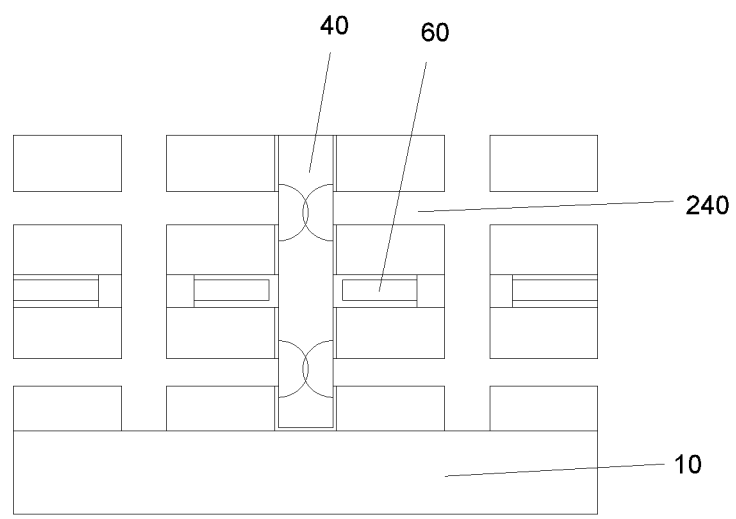
FIG. 15 shows a schematic structural diagram of a cross section of the intermediate body after the heavily doped isolation insulating layers as shown in FIG. 14 are removed to form fourth through holes in contact with source-drain regions.
Figure 16:
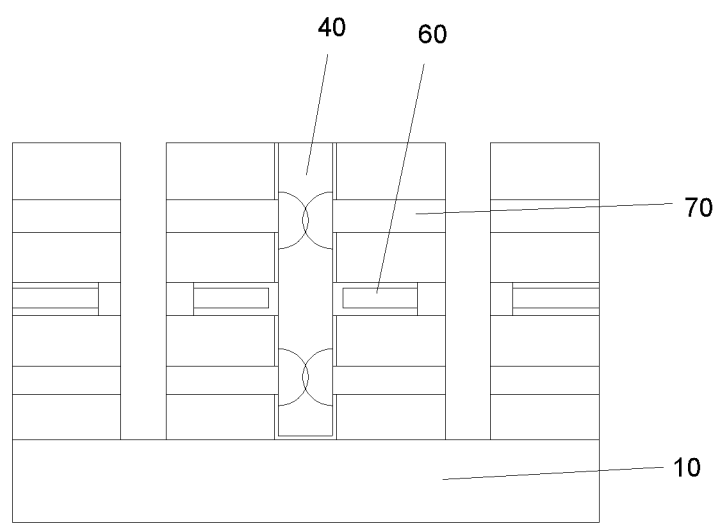
FIG. 16 shows a schematic structural diagram of a cross section of the intermediate body after the fourth through holes as shown in FIG. 15 are filled with a metal material.

In the step S2, the second through hole 220 is formed to expose a part of the heavily doped isolation insulating layer 212. After the step S2, the method may further include following steps. The heavily doped isolation insulating layers 212 are removed form a fourth through hole(s) 240 in contact with the source-drain region(s) 410, as shown in FIG. 15. The fourth through hole(s) 240 is filled with a metal material to form a metal contact layer 70 connected to the source-drain region(s) 410, as shown in FIG. 16.

Based on the foregoing description, it can be seen that embodiments of the present disclosure achieve following technical effects.

In embodiments of the present disclosure, the 1T FRAM with a completely vertical and 3D structure is manufactured with reference to a method for manufacturing 3D NAND. Thereby, the fabricated ferroelectric memory can serve as replacement a conventional DRAM, and a high-density and high-speed memory can be achieved.

Hereinabove described are merely preferable embodiments of the present disclosure, which are not intended to limit the present disclosure. Those skilled in the art may made various modifications and variations based on the present disclosure. Any modification, equivalent substitution, or improvement made within the spirit and the principle of the present disclosure shall fall within the protection scope of the present disclosure.

The invention claimed is:

1. A three-dimensional vertical single-transistor ferroelectric memory, comprising:
   a substrate;
   an insulating dielectric layer disposed on the substrate;
   a channel structure running through the insulating dielectric layer vertically and in contact with the substrate, wherein the channel structure comprises a source-drain region and a channel region in contact with the source-drain region; and
   a gate stack structure surrounding the channel structure in a horizontal plane, wherein the gate stack structure is disposed in the insulating dielectric layer at a position adjacent to the channel region, the gate stack structure comprises a ferroelectric insulating layer and a gate electrode that are sequentially stacked, the gate electrode is at a side of the ferroelectric insulating layer away from the channel structure,
   wherein a first part of the insulating dielectric layer is located directly above the gate stack structure, a second part of the insulating dielectric layer is located directly below the gate stack structure, and
   wherein in the horizontal plane, a third part of the insulating dielectric layer surrounds the gate electrode and is located at a side of the gate electrode away from the channel structure, and the third part is configured to connect the first part and the second part and isolate the gate electrode from outside of the three-dimensional vertical single-transistor ferroelectric memory.

2. The three-dimensional vertical single-transistor ferroelectric memory according to claim 1, wherein
   a channel material of the channel region is one or more of: Si, Ge, GeSi, or a III-V compound semiconductor.

3. The three-dimensional vertical single-transistor ferroelectric memory according to claim 1, wherein
   a ferroelectric material of the ferroelectric insulating layer is one or more of: HZO, HalO, HSiO, or PZT.

4. The three-dimensional vertical single-transistor ferroelectric memory according to claim 1, wherein
   an insulating material of the insulating dielectric layer is one or more of: silicon oxide, oxynitride, or SiCN.

5. The three-dimensional vertical single-transistor ferroelectric memory according to claim 4, further comprising:
   an isolation oxide layer, wherein the isolation oxide layer surrounds the channel structure, and the gate stack structure surrounds the isolation oxide layer.

6. The three-dimensional vertical single-transistor ferroelectric memory according to claim 4, further comprising:
   a metal contact layer, wherein the metal contact layer runs through the insulating dielectric layer and is in contact with the source-drain region.

7. A method for manufacturing a three-dimensional vertical single-transistor ferroelectric memory, comprising:
   S1, forming an insulating material layer on a substrate, and forming a channel structure running through the insulating material layer vertically, wherein the channel structure is in touch with the substrate, and the channel structure comprises a source-drain region and a channel region in contact with the source-drain region; and S2, removing a part of the insulating material layer at a position adjacent to the channel region to form a cavity in the insulating material layer, and forming, in the cavity, a gate stack structure surrounding the channel structure in a horizontal plane, wherein the gate stack structure comprises a ferroelectric insulating layer and a gate electrode that are sequentially stacked, and the gate electrode is at a side of the ferroelectric insulating layer away from the channel structure;

wherein a first part of the insulating dielectric layer is located directly above the gate stack structure, a second part of the insulating dielectric layer is located directly below the gate stack structure, and wherein in the horizontal plane, a third part of the insulating dielectric layer surrounds the gate electrode and is located at a side of the gate electrode away from the channel structure, and the third part is configured to connect the first part and the second part and isolate the gate electrode from outside of the three-dimensional vertical single-transistor ferroelectric memory.

8. The method according to claim 7, wherein a projection of the channel structure on the substrate is a simply-connected domain and is fully covered by a projection of the source-drain region on the substrate.

9. The method according to claim 7, wherein the step S1 comprises:

S11, depositing, on the substrate, non-doped isolation insulating layers and heavily doped isolation insulating layers to form the insulating material layer, wherein the insulating material layer comprises layer groups, each of which comprises one or more of the non-doped isolation insulating layers and one or more of the heavily doped isolation insulating layers that are alternately stacked;

S12, forming, in the insulating material layer, a first through hole reaching the substrate, and filling the first through hole with the channel material; and S13, annealing the heavily doped isolation insulating layer, wherein dopants in the heavily doped isolation insulating layer diffuse laterally into the channel material in the annealing, to forms the source-drain region, and a part of the channel material without the dopants forms the channel region.

10. The method according to claim 9, wherein after forming the first through hole and before filling the first through hole with the channel material, the step S12 further comprises:

depositing an isolation oxide layer on a sidewall of the first through hole, wherein the ferroelectric insulating layer is deposited at a side of the isolation oxide layer away from the channel structure in the step S2.

11. The method according to claim 9, wherein the insulating material layer comprises a first insulating layer stack and a second insulating layer stack, and the step S11 comprises:

forming, on the substrate, at least one of the layer groups to form the first insulating layer stack, wherein a layer that is in the first insulating layer stack and farthest from the substrate is one of the non-doped isolation insulating layers;

forming a dummy gate layer on the first insulating layer stack; and forming, on the dummy gate layer, another at least one of the layer groups to form the second insulating layer stack, wherein a layer that is in the second insulating layer stack and adjacent to the dummy gate layer is another one of the non-doped isolation insulating layers.

12. The method according to claim 11, wherein the step S2 comprises:

S21, forming a second through hole reaching the substrate, in the insulating material layer at two sides of the channel structure, to expose a part of the dummy gate layer, and removing the part of the dummy gate layer to form a third through hole reaching the channel structure, wherein the third through hole connects the second through hole; and S22, filing the third through hole with a ferroelectric material and a gate material sequentially, to form the gate stack structure, wherein the ferroelectric material wraps the gate material.

13. The method according to claim 12, wherein the step S22 comprises:

filling the second through hole and the third through hole, with the ferroelectric material and the gate material sequentially;

etching the ferroelectric material and the gate material in the second through hole, to expose a part of the substrate corresponding to the second through hole;

etching the ferroelectric material and the gate material in the third through hole, to expose a part of a surface of the third through hole, wherein the part of a surface of the third through hole is adjacent to the second through hole; and filling the exposed third through hole with an insulating material, to form an insulating dielectric layer wrapping the gate stack structure.

14. The method according to claim 12, wherein a part of the heavily doped isolation insulating layers is exposed when forming the second through hole in the step S2, and after the step S2, the method further comprises:

removing the heavily doped isolation insulating layers to form a fourth through hole in contact with the source-drain region; and filling the fourth through hole with a metal material, to form a metal contact layer in contact with the source-drain region.

15. The method according to claim 13, wherein the ferroelectric material and the gate material in the third through hole is etched through selective lateral etching.

16. The three-dimensional vertical single-transistor ferroelectric memory according to claim 1, wherein a projection of the channel structure on the substrate is a simply-connected domain and is fully covered by a projection of the source-drain region on the substrate.

* * * * *